United States Patent
Murase

[11] Patent Number: 5,218,291
[45] Date of Patent: Jun. 8, 1993

[54] METER AND METER DRIVING SYSTEM WITH INDICATION FLUCTUATION SUPPRESSION AND ENHANCEMENT

[75] Inventor: Hiroshi Murase, Kyoto, Japan

[73] Assignee: Rohm Co., Ltd., Kyoto, Japan

[21] Appl. No.: 841,478

[22] Filed: Feb. 26, 1992

[30] Foreign Application Priority Data

Mar. 26, 1991 [JP] Japan .................................. 3-61924

[51] Int. Cl.$^5$ ...................... G01R 7/00; G01R 15/10; G01P 3/48; G01D 3/02
[52] U.S. Cl. .................................. 324/143; 324/125; 324/166; 324/167; 324/76.47; 324/76.55; 364/565; 364/581
[58] Field of Search ............ 324/78 D, 115, 125, 324/160, 166, 167, 140 R, 143, 144, 146; 364/565, 581

[56] References Cited

U.S. PATENT DOCUMENTS

| | | | |
|---|---|---|---|
| 4,356,445 | 10/1982 | Congdon | 324/82 |
| 4,380,733 | 4/1983 | Yano et al. | 324/166 |
| 4,485,452 | 11/1984 | Cording et al. | |
| 4,827,209 | 5/1989 | Tanaka et al. | 324/143 |
| 4,890,057 | 12/1989 | Kobayashi et al. | 324/166 X |
| 4,928,060 | 5/1990 | Ito | 324/143 |
| 4,939,675 | 7/1990 | Luitje | 324/166 X |
| 5,017,861 | 5/1991 | Hukuda | 324/143 |
| 5,051,688 | 9/1991 | Murase et al. | 324/143 |

FOREIGN PATENT DOCUMENTS

0379816  8/1990  European Pat. Off. .
0413891  2/1991  European Pat. Off. .

Primary Examiner—Gerard R. Strecker
Attorney, Agent, or Firm—Oliff & Berridge

[57] ABSTRACT

A meter driving system receives pulse signals from a sensor, counting frequencies or periods of the input signals. The counted results are weight-averaged to determine an output value and a value to be indicated. In a weight-averaging process, a weight is varied in response to the frequencies of the input signal. Thus, the meter can give a precise indication regardless of varying input frequencies.

10 Claims, 2 Drawing Sheets

METER AND METER DRIVING SYSTEM WITH INDICATION FLUCTUATION SUPPRESSION AND ENHANCEMENT

BACKGROUND OF THE INVENTION

1. Field of the Invention:

This invention relates to a meter having a pointer actuated by a magnetic field, and to a driving system for such a meter.

2. Description of the Related Art:

the velocity or engine speed of a vehicle is usually indicated by a pointer of a speedmeter or a tachometer. A cross-coil meter is widely used for this purpose.

FIG. 2 of the accompanying drawings shows the operation principle of such a cross-coil meter. The cross-coil meter includes a magnet M and two exciting coils Ls and Lc. The coils Ls, Lc generate magnetic fields having intensities according to currents supplied by a driving system (not shown). These two coils are arranged to be perpendicular to each other. A combined magnetic field composed of the magnetic fields of these coils Ls, Lc is controlled by regulating the currents which are applied to these coils. The magnet M is located so as to be actuated by the combined magnetic field. When it is actuated, the magnet M generates torque, angularly moving according to the torque. A non-illustrated pointer is connected to the magnet M to deflect in response to the angular movement of the magnet M.

The pointer deflects according to the currents applied to the coils Ls, Lc. Therefore, when the currents to the coils Ls, Lc change in response to the measured vehicle or engine speed, the pointer deflects to indicate the varying vehicle or engine speed. FIG. 3 of the accompanying drawings shows a speedometer for a vehicle. In FIG. 3, a pointer I is connected to the magnet M of FIG. 2. An angle $\theta$ corresponds to the angle by which the magnet M is moved due to the combined magnetic field generated by the coils Ls, Lc.

A pulse output type sensor is usually used for detecting the vehicle or engine speed. Some speed sensors generate pulse signals having different frequencies according to detected speeds. When a cross-coil meter is set in motion by an output from such a sensor, it is necessary to use a counter for counting the frequency of pulses, a modulator for performing the pulse width modulation (PWM) according to the counted results of the counter, a driver for supplying PWM-modulated currents to the coils Ls, Lc, and so forth. To deflect the pointer I by the angle $\theta$ according to the value detected by the sensor, a ROM or the like should be used to correspond the counted frequencies with the deflection angle $\theta$.

Usually inputs from the sensor are variable to a certain extent. To operate the cross-coil meter, such variable inputs should preferably be stabilized to prevent unfavorable deflection of the pointer I. For this purpose, the counted frequency of pulses are conventionally averaged in a specified period of time, so that the deflection angle $\theta$ of the pointer is controlled by a mean value. A frequency Fn at a certain time point is determined by the following formula.

$$F_n = (F_{in} + F_{n-1} + F_{n-2} + \ldots + F_{n-a})/(a+1)$$

where a is an integer, $F_{in}$ is an input frequency, $F_{n-1}$ is a frequency which serves as a base for determining the deflection angle $\theta$ at the time point $n-1$, $F_{n-2}$ is another frequency serving as another base for determining the deflection angle $\theta$, and so forth.

When this equation is employed, the calculation results ($F_{n-1}$ to $F_{n-a}$) should be obtained until the time point a, which means a slow response. To improve the response, a formula for obtaining a weight average has been studied and in use now.

$$F_n = \alpha F_{n-1} + (1-\alpha) F_{in}$$

where $\alpha$ is a constant ($0 < \alpha < 1$).

However, even when $F_n$ is obtained by using the second formula, the foregoing calculation has to be repeated each time a new frequency is counted by the counter, resulting in too quick a response in some cases, or too slow a response in other cases. For example, when a cross-coil meter is operated by a sensor for outputting high frequency pulses, the number of calculations per unit time is increased to make the pointer I fluctuate extensively. Otherwise, the number of calculations per unit time becomes too few to reduce the pointer's responsiveness.

SUMMARY OF THE INVENTION

It is therefore an object of the invention to provide a meter which is very responsive to any variation in input frequency but can prevent unnecessary fluctuation of its pointer.

According to the invention, there is provided a meter driving system comprising: means for weight-averaging measured frequency or period values of input signals and a present meter indication so as to successively renew the meter indication; and means for varying a weight for renewing the meter indication according to the measured frequency or period values of the input signal so that fluctuation of the meter indication is accordingly suppressed when high signal frequencies are inputted, and fluctuation of the meter indication is accordingly enhanced when low signal frequencies are inputted.

With this arrangement, the meter can give an accurate indication irrespective of varying input signal frequencies.

The driving system of the invention further includes: a reference clock generator for generating reference clock signals having a predetermined period; a counter for counting the number of the reference clock signals generated within a predetermined number of the periods of the input signal so as to output the counted results as data representing the period of the input signal; and means for measuring the frequency of the input signals based on the counted results of the counting means.

The frequencies or periods of the input signals are measured by the counter according to the number of reference clock signals which are generated during a specified period of the input signal.

To renew the meter indication, the output values are obtained by weight-averaging the measured values. Then the output values are weight-averaged to determine the indication to be given. Different weights may be used to calculate the output value and to obtain the indication based on the calculated output values.

To operate indicating means such as a cross-coil meter having a pointer, a deflection angle of the pointer is firstly determined based on the indication to be given.

Then, the pointer is angularly moved according to the determined deflection angle.

When the indication means has a plurality of exciting coils, effective values of exciting current to these coils are controlled, being supplied to the coils. Means for determining the signs of the exciting currents may be used when the exciting currents are controlled by pulse width modulation.

DETAILED DESCRIPTION OF THE PREFERRED EMBODIMENT

Figure 1:
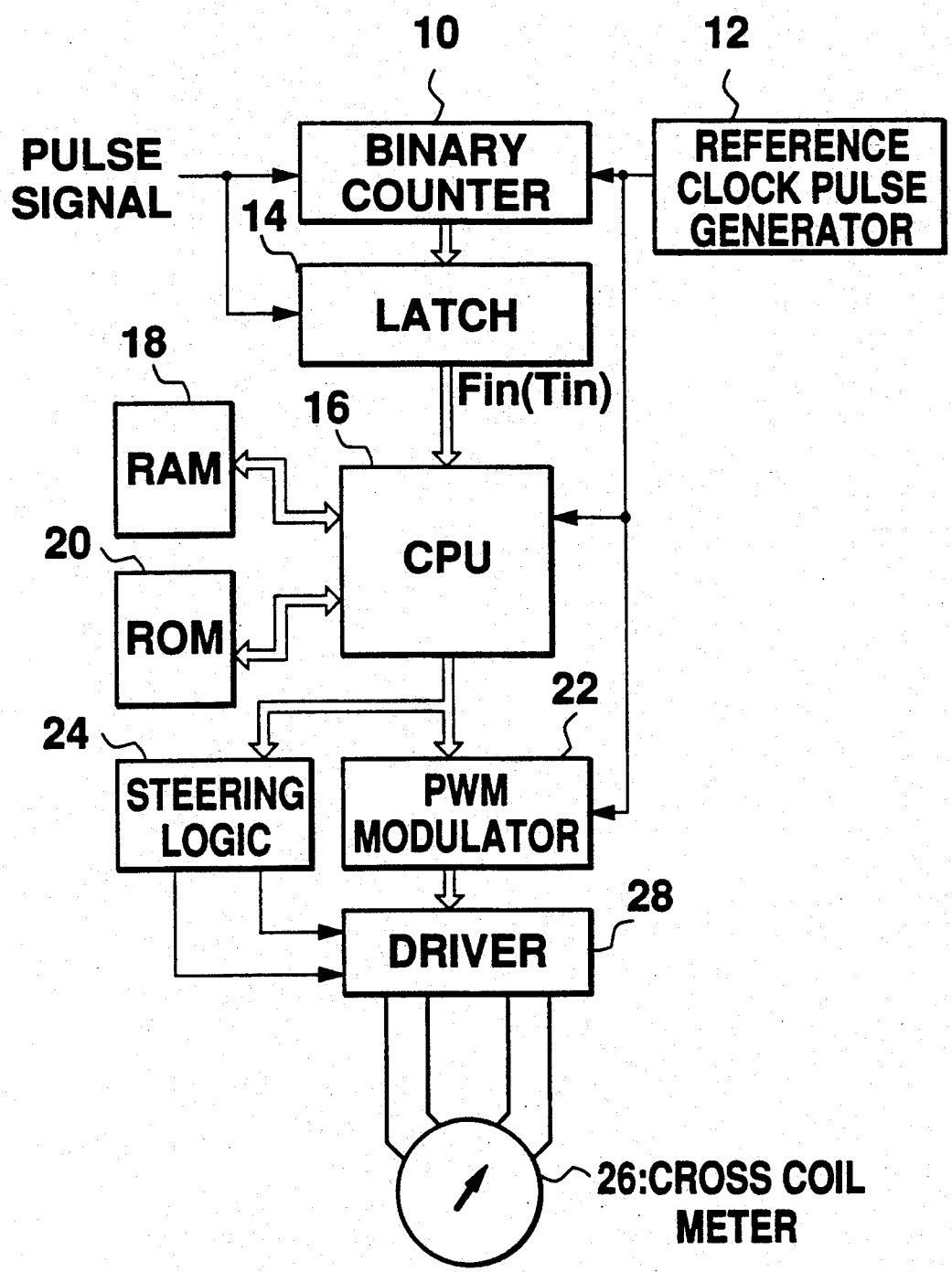
FIG. 1 is a block diagram showing the configuration of a drive meter according to the invention.
Figure 2:
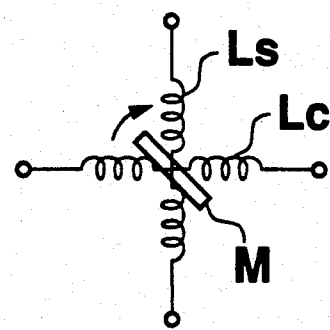
FIG. 2 shows the principle of a cross-coil meter.
Figure 3:
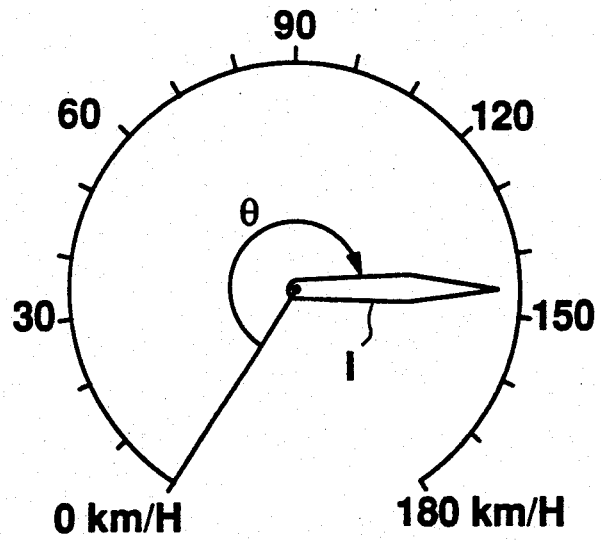
FIG. 3 shows an example of an indication given by a speed meter.

FIG. 1 shows a driving system for operating a meter of the invention. The driving system receives signals from a pulse output type sensor to drive a cross-coil meter 26.

Signals from the sensor are firstly counted by a binary counter 10, which recognizes a period of the received signals based on reference clock signals generated by a reference clock generator 12. When the signals from the sensor have the period $T_{in}$, the binary counter 10 counts the number of pulses generated between the rise and immediate fall of the signals from the sensor. Thus, a half period $T_{in}/2$ of the sensor signals is detected with specified precision. The binary counter 10 may count the number of reference pulses generated between the fall and immediate rise of the signals from the sensor. The binary counter 10 may also count intervals between falls of the signals from the sensor. The driving system of FIG. 1 can perform these counting operations.

A latch 14 latches the counted results of the binary counter 10. Latch timing corresponds to the timing of rise or fall of the signals from the sensor. The rise or fall timing of the signals is selected as the latch timing depending on which of the three foregoing operations is executed by the binary counter 10. The value latched by the latch 14 directly or indirectly represents the period $T_{in}$ of the signals outputted by the sensor. Since the period $T_{in}$ is a reciprocal of a frequency $F_{in}$, the value latched by the latch 14 is a value of the frequency $F_{in}$. The reference clock signals are also supplied to a CPU 16 and PWM modulator 22 for synchronization, as described later.

The CPU 16 performs the calculations based on the value latched by the latch 14, i.e. data representing the period $T_{in}$ or frequency $F_{in}$ of the signal outputted by the sensor, thereby controlling the indication to be given by the cross-coil meter 26.

The CPU 16 performs its control operation according to a preset program. Specifically, the CPU 16 is connected to a ROM 20 for storing the calculation program. The ROM 20 stores not only the calculation program but also various coefficients (such as $\beta$ and $\alpha_m$) to be used for the calculations. The CPU 16 executes the control calculations while storing in RAM 18 intermediate aspects or results of the calculations.

The CPU 16 controls the indication of the cross-coil meter 26 as follows.

Firstly, the CPU 16 reads the data latched by the latch 14. The data represent the period $T_{in}$ or frequency $F_{in}$ of the signals outputted by the sensor as described above. Then, the CPU 16 determines the output value $F_n$ based on the period $T_{in}$ or frequency $F_{in}$.

The CPU 16 determines the output value $F_n$ by using a response coefficient $\beta$ which is a feature of the invention. The following formula is used for this purpose.

$$F_{in} = 1/T_{in} \qquad (1)$$

$$\alpha = \beta F_{in}/(\beta F_{in}+1) \qquad (2)$$

$$F_n = \alpha F_{n-1} + (1-\alpha)F_{in} \qquad (3)$$

where $\beta$ is a constant. The CPU 16 determines the output value $F_n$ based on the frequency $F_{in}$ by using the formulas (2) and (3).

As can be seen from the formula (2), when the frequency $F_{in}$ of the pulse signals from the sensor is high, the weight $\alpha$ of $F_{n-1}$ in the formula (3) is approximate to 1, i.e. the weight becomes heavy. On the contrary, the weight $(1-\alpha)$ of the frequency $F_{in}$ becomes light. The output value $F_n$ of the CPU 16 tends to deviate from the frequency $F_{in}$ of the pulse signal as the frequency $F_{in}$ becomes high.

The CPU 16 stores the output value $F_n$ as $F_{n-1}$ in RAM 18. In other words, $F_{n-1}$ is renewed in the RAM 18. The CPU 16 also calculates and outputs a value $F_m$ to be indicated.

The PWM modulator 22 has a register for storing the value $F_m$ to be indicated. This register is not shown in FIG. 1. The value $F_m$ is calculated by using the weight-averaging formula (4).

$$F_m = \alpha_m F_{m-1} + (1-\alpha_m)F_n \qquad (4)$$

where $\alpha_m$ is a constant. The CPU 16 uses the value $F_m$ to renew the contents of a register of the PWM modulator 22.

The PWM modulator 22 determines a deflection angle $\theta$ of the cross-coil meter 26 based on the value $F_m$ which is calculated by the CPU 16 and stored in the register of the PWM modulator 22. As described above, the period or frequency of the pulse signals from the sensor corresponds to the value detected by the sensor, e.g. speed. Therefore, the CPU 16 calculates the value $F_m$ by using the foregoing formulas, determining the deflection angle $\theta$ of the cross-coil meter 26 so that the detected value of the sensor is indicated by the cross-coil meter 26. The PWM modulator 22 determines the deflection angle $\theta$ by referring to a table (not shown) in the memory.

The PWM modulator 22 generates two kinds of signals, sine and cosine signals, based on the deflection angle $\theta$, outputting these signals to a driver 28. The driver 28 operates the cross-coil meter 26 in response to the received sine and cosine signals. Specifically, the PWM modulator 22 supplies the driver 28 with the sine and cosine signals representing the absolute values of $\sin \theta$ and $\cos \theta$. Then, the driver 28 provides the two coils of the cross-coil meter 26 with currents having effective values corresponding to the two PWM signals, respectively.

The driver 28 requires information concerning the signs of $\sin \theta$ and $\cos \theta$. A steering logic 24 determines the signs of $\sin \theta$ and $\cos \theta$ based on the output value $F_n$ and the value $F_m$ (to be indicated), thereby supplying them to the driver 28. When the value $F_m$ to be indicated is in the first quadrant, both $\sin \theta$ and $\cos \theta$ are positive. Therefore, the steering logic 24 sends the driver 28 the signals denoting that the signals sin θ and cos θ are positive. Receiving the sine and cosine signals from the PWM modulator 22 and signals representing the signs of these signals, the driver 28 operates the cross-coil meter 26 accordingly.

In the foregoing embodiment, the weight coefficient α in the formula (3) is determined according to the frequency $F_{in}$ when the CPU 16 calculates the output value $F_n$. The higher the frequency $F_{in}$, the less the cross-coil meter 26 is responsive to the input from the sensor so as to indicate the value $F_m$ precisely. It is therefore possible to overcome the inconvenience with conventional meters that the higher the input frequency $F_{in}$, the more extensively the meter 26 tends to deflect its pointer.

The lower the frequency $F_{in}$, the more the meter 26 becomes responsive to the input from the sensor so as to give an accurate indication of the value $F_m$.

The invention being thus described, it will be obvious that the same may be varied in many ways. Such variations are not to be considered as a departure from the spirit and scope of the invention, and all such modifications as would be obvious to one skilled in the art are intended to be included within the scope of the following claims.

What is claimed is:

1. A driving system for operating a meter, said driving system comprising:
   (a) means for measuring at least one of frequencies and periods of input signals from a meter sensor;
   (b) means for varying a weight coefficient in accordance with said at least one of said measured frequencies and periods of said input signals so that fluctuations of meter indications of said meter are accordingly suppressed when said input signals from said meter sensor have at least one of high frequencies and short periods, and fluctuations of meter indications of said meter are accordingly enhanced when said input signals from said meter sensor have at least one of low frequencies and long periods; and
   (c) means for weight-averaging said at least one of said measured frequencies and periods of said input signals and a present meter indication of said meter in accordance with said weight coefficient of said weight coefficient varying means so as to provide a renewed meter indication for said meter.

2. A driving system according to claim 1, wherein said frequency measuring means includes:
   a reference clock generator for generating reference clock signals having a predetermined period;
   means for counting the number of the reference clock signals generated within a predetermined number of the periods of the input signals so as to output the counted results as data representing the period of the input signals; and
   means for calculating frequencies of the input signals based on the measured results of said counting means.

3. A driving system according to claim 1, wherein said period measuring means includes:
   a reference clock generator for generating reference clock signals having a predetermined period; and
   means for counting the number of the reference clock signals generated within a predetermined number of the periods of the input signals so as to output the counted results as data representing the period of the input signals.

4. A driving system for operating a meter, said driving system comprising:
   (a) means for measuring at least one of frequencies and periods of input signals from a meter sensor;
   (b) means for varying a first weight coefficient in accordance with said at least one of said measured frequencies and periods of said input signals so that fluctuations of meter indications of said meter are accordingly suppressed when said input signals from said meter sensor have at least one of high frequencies and short periods, and fluctuations of meter indications of said meter are accordingly enhanced when said input signals from said meter sensor have at least one of low frequencies and long periods;
   (c) means for weight-averaging said at least one of said measured frequencies and periods of said input signals and a present output value of said weight-averaging means in accordance with said first weight coefficient of said weight coefficient varying means so as to provide a renewed output value; and
   (d) means for weight-averaging said renewed output value and a present meter indication of said meter in accordance with a second weight coefficient so as to provide a renewed meter indication for said meter.

5. A driving system according to claim 4, wherein said frequency measuring means includes:
   a reference clock generator for generating reference clock signals having a predetermined period;
   means for counting the number of the reference clock signals generated within a predetermined number of the periods of the input signals so as to output the counted results as data representing the period of the input signals; and
   means for calculating frequencies of the input signals based on the counted results of said counting means.

6. A driving system according to claim 4, wherein said period measuring means includes:
   a reference clock generator for generating reference clock signals having a predetermined period; and
   means for counting the number of the reference clock signals generated within a predetermined number of the periods of the input signals so as to output the counted results as data representing the period of the input signal.

7. A meter comprising:
   (a) means for measuring at least one of frequencies and periods of input signals from a meter sensor;
   (b) means for varying a weight coefficient in accordance with said at least one of said measured frequencies and periods of said input signals so that fluctuations of a pointer of said meter are accordingly suppressed when said input signals from said meter sensor have at least one of high frequencies and short periods, and fluctuations of said pointer are accordingly enhanced when said input signals from said meter sensor have at least one of low frequencies and long periods;
   (c) means for weight-averaging said at least one of said measured frequencies and periods of said input signals and a present meter indication of said pointer in accordance with said weight coefficient of said weight coefficient varying means so as to provide a renewed meter indication; and (d) means for renewing an indication of said pointer in accordance with said renewed meter indication.

8. A meter according to claim 7, wherein said indicating means includes a plurality of exciting coils, and said pointer moving means includes a member for calculating effective values of exciting currents according to the determined deflection angle, and a member for controlling the exciting currents to be supplied to said exciting coils according to the calculated effective values of the exciting currents.

9. A meter according to claim 7, further including means for determining an angle by which said pointer must be moved so as to provide said renewed meter indication, and wherein said renewing means includes means for moving said pointer by the determined angle.

10. A meter according to claim 9, wherein said pointer moving means includes a member for determining the signs of the exciting currents according to the determined deflection angle of said pointer.

* * * * *